US 11,876,494 B2

(12) United States Patent
Kim et al.

(10) Patent No.: US 11,876,494 B2
(45) Date of Patent: Jan. 16, 2024

(54) PROTECTION CIRCUIT OF POWER AMPLIFIER AND POWER AMPLIFIER INCLUDING THE SAME

(71) Applicant: Samsung Electro-Mechanics Co., Ltd, Suwon-si (KR)

(72) Inventors: Gyu-Suck Kim, Suwon-si (KR); Youngsik Hur, Suwon-si (KR); Geunyong Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 359 days.

(21) Appl. No.: 17/243,906

(22) Filed: Apr. 29, 2021

(65) Prior Publication Data

US 2022/0209728 A1 Jun. 30, 2022

(30) Foreign Application Priority Data

Dec. 29, 2020 (KR) ........................ 10-2020-0186673

(51) Int. Cl.
*H03F 1/30* (2006.01)
*H03F 3/24* (2006.01)
*H03F 1/52* (2006.01)
*H03F 3/195* (2006.01)

(52) U.S. Cl.
CPC ............. *H03F 3/245* (2013.01); *H03F 1/302* (2013.01); *H03F 1/52* (2013.01); *H03F 3/195* (2013.01); *H03F 2200/318* (2013.01); *H03F 2200/451* (2013.01)

(58) Field of Classification Search
CPC .... H03F 1/30; H03F 3/20; H03F 1/52; H03G 3/30

USPC .............................. 330/296, 285, 298, 207 P
See application file for complete search history.

(56) References Cited

U.S. PATENT DOCUMENTS

| | | | | |
|---|---|---|---|---|
| 6,842,075 | B2* | 1/2005 | Johnson | G05F 3/265 330/296 |
| 7,345,547 | B2* | 3/2008 | Wang | H03F 3/605 330/296 |
| 8,917,144 | B2* | 12/2014 | Iyomasa | H03F 3/60 330/285 |
| 9,013,238 | B2* | 4/2015 | Ding | H03F 1/0261 330/296 |
| 10,263,571 | B2* | 4/2019 | Han | H03F 1/0205 |
| 10,291,191 | B2 | 5/2019 | Teeter et al. | |
| 2014/0232459 | A1* | 8/2014 | Iizuka | H03F 1/0222 330/130 |
| 2020/0313703 | A1 | 10/2020 | Choi et al. | |

FOREIGN PATENT DOCUMENTS

KR 10-2020-0114745 A 10/2020

* cited by examiner

*Primary Examiner* — Henry Choe
(74) *Attorney, Agent, or Firm* — NSIP Law

(57) ABSTRACT

A protection circuit is provided. The protection circuit protects a power amplifier that includes a power transistor configured to receive a power voltage, and a bias circuit configured to supply a bias current to the power transistor. The protection circuit includes: a first transistor, connected between a terminal of the bias circuit and a ground, and configured to sink a first current from the terminal of the bias circuit; and a second transistor, comprising a first terminal connected to the power voltage, a second terminal connected to a control terminal of the first transistor, and a control terminal connected to a reference voltage.

22 Claims, 6 Drawing Sheets

PROTECTION CIRCUIT OF POWER AMPLIFIER AND POWER AMPLIFIER INCLUDING THE SAME

CROSS-REFERENCE TO RELATED APPLICATIONS

This application claims the benefit under 35 U.S.C. § 119 to Korean Patent Application No. 10-2020-0186673, filed on Dec. 29, 2020, in the Korean Intellectual Property Office, the entire disclosure of which is incorporated herein by reference for all purposes.

BACKGROUND

1. Field

The following description relates to a protection circuit of a power amplifier, and a power amplifier including the same.

2. Description of Related Art

In wireless communication systems, various digital modulation and demodulation methods are applied according to the evolution of communication standards. A typical code division multiple access (CDMA) communication system adopts the quadrature phase shift keying (QPSK) method, and an orthogonal frequency division multiplexing (OFDM) method is adopted for the Wireless LAN according to the IEEE communication standard. Additionally, recently, Long Term Evolution (LTE) and LTE-Advanced, which are the 3GPP standard, employ QPSK, quadrature amplitude modulation (QAM), and OFDM schemes. These wireless communication standards implement a linear modulation scheme that requires that the intensity or phase of a transmission signal is maintained during transmission.

A transmission and/or reception device used in a wireless communication system includes a power amplifier that amplifies a radio frequency (RF) signal in order to increase a transmission distance. Therefore, it may be necessary to amplify the power amplifier while maintaining linearity with respect to the intensity and phase of the transmission signal. Here, linearity means that power of an output signal is constantly amplified and the phase is maintained at the same time according to fluctuation of an input signal.

In the next-generation wireless communication system, broadband, multimedia, and intelligence are trending, and accordingly, demand for broadband, linearity, and intelligence of power amplifiers is increasing.

It may be beneficial that the power amplifier have a rugged form factor that reduces influence on an external environment. The power amplifier operates by an external power supply voltage, and this power supply voltage may exceed an operating range of the power amplifier. That is, when the power voltage exceeds a predetermined threshold voltage, the power amplifier may be damaged or destroyed. Accordingly, a circuit to protect the power amplifier may be beneficial.

The above information disclosed in this Background section is only for enhancement of understanding of the background of the invention, and therefore it may contain information that does not form the prior art that is already known in this country to a person of ordinary skill in the art.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a protection circuit, configured to protect a power amplifier comprising a power transistor configured to receive a power supply voltage, and a bias circuit configured to supply a bias current to the power transistor is provided. The protection circuit includes a first transistor, connected between a terminal of the bias circuit and a ground, and configured to sink a first current from the terminal of the bias circuit; and a second transistor, including a first terminal connected to the power supply voltage, a second terminal connected to a control terminal of the first transistor, and a control terminal connected to a reference voltage.

The first current may be fluctuated abased on the power supply voltage.

The first current may increase when the power supply voltage increases above a first threshold voltage, and a second current flowing through the power transistor may decrease when the first current increases.

When the power supply voltage is greater than the first threshold voltage, a voltage at the second terminal of the second transistor may increase, and a voltage at the control terminal of the first transistor may increase.

When the power amplifier operates, the reference voltage may be applied to the control terminal of the first transistor, and when the power amplifier does not operate, the reference voltage may not be applied to the control terminal of the first transistor.

When the power supply voltage is greater than the first threshold voltage and less than a second threshold voltage, the first transistor may operate in a saturation area, and when the power supply voltage is greater than the second threshold voltage, the second transistor may operate in an active area.

When the first transistor operates in the saturation area, the second current may decrease as the power supply voltage increases, and when the second transistor operates in the active area, the second current may not flow.

The control terminal of the second transistor may be connected to the reference voltage through a first resistor.

The second terminal of the second transistor may be connected to the ground through a second resistor.

The protection circuit may further include at least one additional transistor connected between the power supply voltage and the first terminal of the second transistor, and the at least one additional transistor may be configured to have a diode connection structure.

The protection circuit may further include a third resistor connected between the power supply voltage and the at least one additional transistor.

The bias circuit may include a third transistor, including a first terminal connected to a power supply current, and configured to sink a predetermined current from the power supply current; and a fourth transistor, including a control terminal connected to the power supply current, and configured to supply the bias current, wherein the terminal of the bias circuit is a second terminal of the third transistor.

In a general aspect, a power amplifier includes a power transistor, configured to amplify an input radio frequency (RF) signal; a bias circuit, configured to supply a bias current to the power transistor; and an overvoltage protection circuit, configured to detect a power voltage supplied to the power transistor, and sink a first current from a terminal of the bias circuit corresponding to the power voltage, and the overvoltage protection circuit includes a first transistor, comprising a first terminal connected to the power voltage, and configured to output a first voltage corresponding to the power voltage to a second terminal of the first transistor, and a second transistor, comprising a control terminal connected to the second terminal of the first transistor, and a first terminal connected to the terminal of the bias circuit, wherein the second transistor may be configured to sink the first current corresponding to the first voltage.

A control terminal of the first transistor may be connected to a reference voltage, and when the power amplifier operates, the reference voltage may be applied to the control terminal of the first transistor.

When the power amplifier does not operate, the reference voltage may not be applied to the control terminal of the first transistor.

The overvoltage protection circuit may further include at least one additional transistor connected between the power voltage and the first terminal of the first transistor, and the additional transistor may be configured to have a diode connection structure, and a first resistor, connected between the second terminal of the first transistor and a ground.

When the power voltage increases, the first current may increase, and when the first current increases, a second current flowing through the power transistor may decrease.

The bias circuit may further include a third transistor, comprising a first terminal connected to a power current, and configured to sink a predetermined current from the power current, and a fourth transistor, comprising a control terminal connected to the power current, and configured to supply the bias current, wherein the terminal of the bias circuit is a second terminal of the third transistor.

In a general aspect, a transmission device includes a power amplifier, configured to amplify a radio frequency (RF) signal, the power amplifier including an overvoltage protection circuit; a power transistor, configured to amplify power with respect to the RF signal; and a bias circuit, configured to supply a bias current to the power transistor; wherein the overvoltage protection circuit includes a first transistor, connected to a terminal of the bias circuit, and configured to sink a current received from the terminal of the bias circuit; a second transistor, comprising an emitter connected to a base of the first transistor, and a base connected to a reference voltage, and a third transistor, comprising an emitter connected to a collector of the second transistor, and a collector connected to a power supply voltage.

The overprotection circuit may be configured to operate when the power supply voltage exceeds a first threshold, and sink the current received from the terminal of the bias circuit.

The base of the second transistor may be connected to the reference voltage through a first resistor, and the emitter of the second transistor may be connected to a ground through a second resistor.

The power amplifier may further include an input matching network and an output matching network, and the input matching network may be connected to a base of the power transistor, and may be configured to perform impedance matching between the RF signal and the power transistor.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
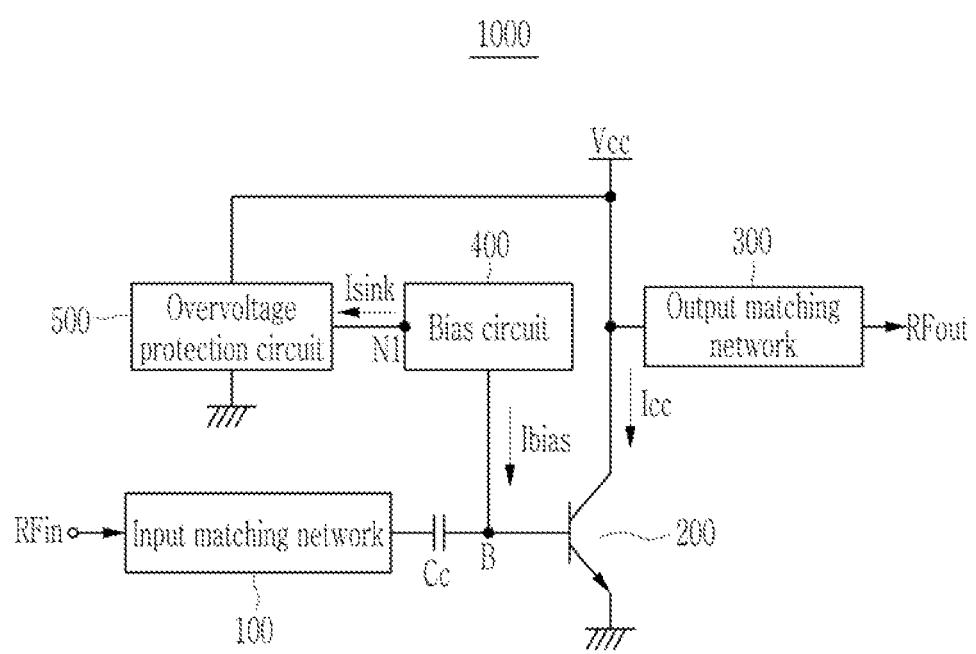
FIG. 1 is a schematic diagram of an example power amplifier, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a predetermined order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Throughout the specification, RF signals are Wi-Fi (IEEE 802.11 family, etc.), WiMAX (IEEE 802.16 family, etc.), IEEE 802.20, long term evolution (LTE), Ev-DO, HSPA, HSDPA, HSUPA, EDGE, GSM, GPS, GPRS, CDMA, TDMA, DECT, Bluetooth, 3G, 4G, and 5G, and may have a format according to any other wireless and wired protocols designated later, but is not limited thereto.

The examples may be applied to envelope elimination and restoration (EER) a power amplifier, a digital predistortion power amplifier, a Doherty power amplifier, a switch mode power amplifier, a GaN power amplifier and a CMOS power amplifier. The examples may also improve broadband characteristics and nonlinear characteristics of power amplifiers. Additionally, the power amplifier disclosed herein may be implemented in a transmission and/or reception device.

FIG. 1 is a schematic diagram of an example power amplifier, in accordance with one or more embodiments.

As shown in FIG. 1, an example power amplifier 1000, in accordance with one or more embodiments, may include an input matching network 100, a power transistor 200, an output matching network 300, a bias circuit 400, and an overvoltage protection circuit 500.

The input matching network 100 may be connected with an input terminal B (i.e., base) of the power transistor 200, and may perform impedance matching between an input radio frequency (RF) signal RFin and the power transistor 200. Additionally, the output matching network 300 may be connected to an output terminal (i.e., a collector) of the power transistor 200, and may perform impedance matching between an output RF signal RFout and the next stage (i.e., the next stage of the power amplifier). The input matching network 100 and the output matching network 300 may be respectively implemented by combination of at least one of a resistor, an inductor, and a capacitor.

The power transistor 200 amplifies power with respect to the RF signal RFin input to the input terminal B, and may then output the amplified power to the output terminal (i.e., the collector). That is, a base of the power transistor 200 is input with an RF signal to be amplified, and the collector of the power transistor 200 may output an amplified RF signal. An emitter of the power transistor 200 may be connected to a ground. Additionally, the collector of the power transistor 200 may be connected to a power supply voltage Vcc, and the power transistor 200 may be driven by the power supply voltage Vcc. In FIG. 1, a current flowing through the output terminal (i.e., the collector) of the power transistor 200 is denoted by Icc. Meanwhile, the collector of the power transistor 200 may be connected to the power supply voltage Vcc through an inductor (not shown in FIG. 1) that performs an RF choke function.

Depending on an external condition (e.g., battery conditions), the power supply voltage Vcc may enter an overvoltage state that is greater than an operating voltage state (a state exceeding a predetermined threshold value). When the power supply voltage Vcc is in the overvoltage state, the power transistor 200 may be damaged or destroyed. To prevent this situation, the overvoltage protection circuit 500 according to the example performs a function of protecting the power transistor 200 by detecting an overvoltage state of the power supply voltage Vcc.

The power transistor 200 may be implemented as various transistors such as, but not limited to, a heterojunction bipolar transistor (HBT), a bipolar junction transistor (BJT), an insulated gate bipolar transistor (IGBT), and the like. Additionally, in FIG. 1, the power transistor 200 is described as a npn type, but it may be replaced with a pnp type.

A coupling capacitor Cc may be connected to the input terminal (i.e., the base) of the power transistor 200. The coupling capacitor Cc may perform a function of blocking a direct current (DC) component from an RF signal.

The bias circuit 400 may supply a bias current Ibias biasing the power transistor 200. The power transistor 200 may set a bias level (i.e., a bias point) through the bias current Ibias provided from the bias circuit 400. In the example, the bias current Ibias is reduced in the overvoltage state due to operation of the overvoltage protection circuit 500, and this will be described in detail hereinafter.

The overvoltage protection circuit 500 may be connected between the power supply voltage Vcc and the ground. Additionally, the overvoltage protection circuit 500 may be connected to a terminal N1 of the bias circuit 400, and may sink a current Isink from the terminal N1 of the bias circuit 400. The overvoltage protection circuit 500 operates when the power supply voltage Vcc exceeds a predetermined threshold value, and sinks the current Isink from the bias circuit 400. Due to such a current Isink, the bias current Ibias may be fluctuated. As an example, when the current Isink is increased, the bias current Ibias may be reduced, and in this case, a current Icc flowing through the power transistor 200 may be reduced. Accordingly, the power transistor 200 can be prevented from the overvoltage state. A detailed configuration and operation method of the overvoltage protection circuit 500 will be described in detail with reference to FIG. 2.

Figure 2:
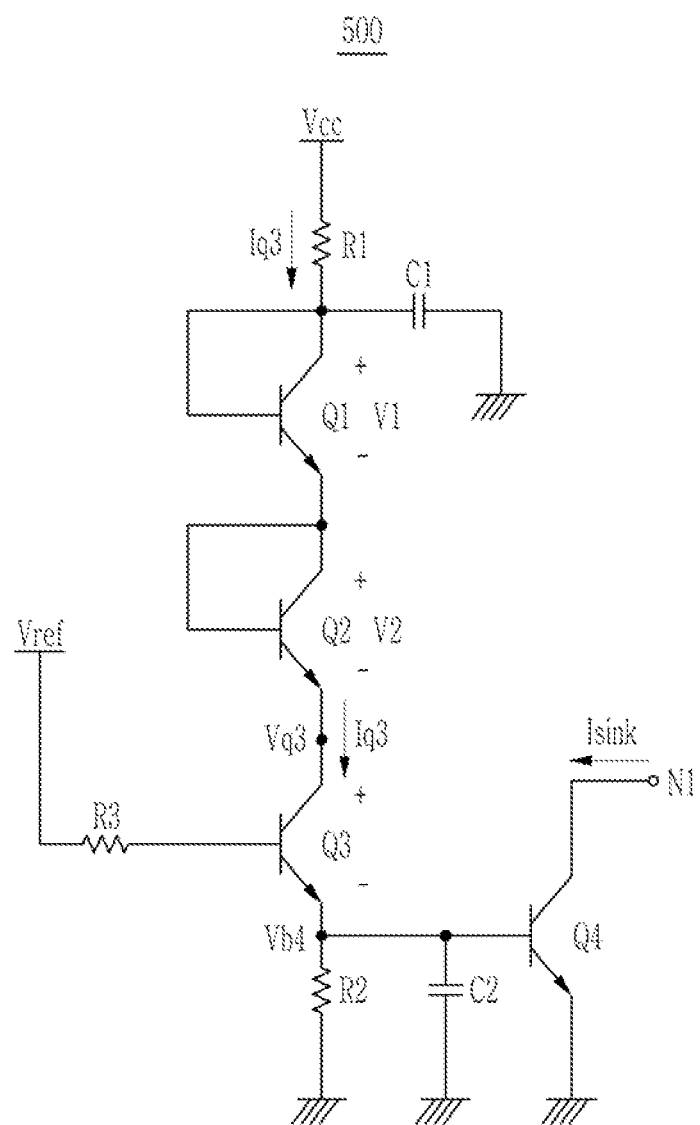
FIG. 2 illustrates an example overvoltage protection circuit, in accordance with one or more embodiments.

FIG. 2 illustrates an example overvoltage protection circuit, in accordance with one or more embodiments.

As illustrated in FIG. 2, an overvoltage protection circuit 500, in accordance with one or more embodiments, may include a transistor Q1, a transistor Q2, a transistor Q3, a transistor Q4, a resistor R1, a resistor R2, a resistor R3, a capacitor C1, and a capacitor C2.

The transistors Q1 to Q4 may be respectively implemented as various transistors such as, but not limited to, a heterojunction bipolar transistor (HBT), a bipolar junction transistor (BJT), an insulated gate bipolar transistor (IGBT), and the like. Additionally, in FIG. 2, the transistors Q1 to Q4 are described as a npn type. However, this is only an example, and the transistors Q1 to Q4 may be implemented with a pnp type.

A base and a collector of the transistor Q1 may be connected with each other, and the collector of the transistor Q1 may be connected to the power supply voltage Vcc. The transistor Q1 may have a diode connection structure, and in FIG. 2, V1 denotes a voltage at opposite ends of the transistor Q1.

A base and a collector of the transistor Q2 may be connected with each other, and the collector of the transistor Q2 may be connected to an emitter of the transistor Q1. The transistor Q2 may have a diode connection structure, and in FIG. 2, V2 denotes a voltage at opposite ends of the transistor Q2.

A collector of the transistor Q3 may be connected to an emitter of the transistor Q2, and a base (which may be a control terminal) of the transistor Q3 may be connected to a reference voltage Vref through the resistor R3. An emitter of the transistor Q3 may be connected to the ground through the resistor R2. In an example, the reference voltage Vref is a power supply voltage supplied from an external source when the power amplifier 1000 operates (i.e., when ON). In an example, the reference voltage Vref may be set to a lower voltage than the power supply voltage Vcc.

A collector of the transistor Q4 may be connected to the terminal N1 of the bias circuit 400, and an emitter of the transistor Q4 may be connected to the ground. Additionally, a base (which may be a control terminal) of the transistor Q4 may be connected to the emitter of the transistor Q3. That is, when the power supply voltage Vcc exceeds a predetermined threshold voltage, the transistor Q4 may sink the current Isink from the terminal N1 of the bias circuit 400. In this example, a current flowing through the collector of the transistor Q4 is the current Isink. The transistor Q4 may generate the current Isink in response to a voltage Vb4 applied through the base of transistor Q4.

In FIG. 2, Vq3 denotes a collector voltage of the transistor Q3, and Vb4 denotes an emitter voltage (i.e., a base voltage of the transistor Q4) of the transistor Q3. Additionally, Iq3 denotes a current flowing through the transistors Q1, Q2, and Q3 when the overvoltage protection circuit 500 operates.

Meanwhile, since the transistor Q3 serves to generate the current Iq3 flowing through the transistors Q1, Q2, and Q3, a determination may be made whether the overvoltage protection circuit 500 can be operated. Even when the power amplifier 1000 does not operate (particularly, when the power transistor 200 and the bias circuit 400 do not operate), the overvoltage protection circuit 500 may be applied with the power supply voltage Vcc. In such an example, a leakage current may flow to the overvoltage protection circuit 500, and the leakage current may exceed a limit range. As described above, since the reference voltage Vref applied to the base of the transistor Q3 is a power voltage supplied from an external source only when the power amplifier 1000 operates (i.e., when ON), the transistor Q3 does not operate when the power amplifier 1000 does not operate (i.e., when OFF). That is, since the reference voltage Vref is not applied to the transistor Q3 when the power amplifier 1000 does not operate, the overvoltage protection circuit 500 does not operate. That is, an unnecessary leakage current can be prevented by the transistor Q3.

The capacitor C1 may be connected between the collector of the transistor Q1 and the ground, and may perform removal of an alternating current (AC) component from the power supply voltage Vcc. Additionally, the capacitor C2 may be connected between the base of the transistor Q4 and the ground, and may perform removal of the AC current from the voltage Vb4.

When the transistors Q1, Q2, and Q3 are in an operating state (i.e., a state of operating in an active area), the current Iq3 flowing through the transistors Q1, Q2, and Q3 can be represented as shown in Equation 1 below.

$$Iq3=\{VCC-(Vq3+V2+V1)\}/R1 \qquad \text{Equation 1:}$$

In an example, the base current of transistor Q3 may be a very small value compared to the current Iq3. Accordingly, it may be ignored. Considering this, the current flowing through the resistor R2 (i.e., an emitter current of the transistor Q3) corresponds to the current Iq3. Accordingly, the base voltage Vb4 of the transistor Q4 may be represented as shown in Equation 2 below.

$$Vb4=Iq3*R2 \qquad \text{Equation 2:}$$

When the current Iq3 in Equation 2 is replaced with Equation 1, the base voltage Vb4 of the transistor Q4 can be represented as shown in Equation 3.

$$Vb4=\{VCC-(Vq3+V2+V1)\}*R2/R1 \qquad \text{Equation 3:}$$

Referring to Equation 3, when the power supply voltage Vcc increases, the base voltage Vb4 of the transistor Q4 is increased. When the base voltage Vb4 of the transistor Q4 is increased, the current Isink flowing through the transistor Q4 is increased. That is, when the power supply voltage Vcc increases, the current Isink increases. Specifically, when the power supply voltage Vcc exceeds the predetermined threshold voltage and thus the overvoltage protection circuit 500 operates, the current Isink increases according to the power supply voltage Vcc.

The operation of the transistor Q4 may be determined by the power supply voltage Vcc in the overvoltage state of the power amplifier 1000 (e.g., a ruggedness test condition or an absolute maximum rate (AMR) test condition). In an example, when the power supply voltage Vcc is 5 V in the overvoltage state, the overvoltage protection circuit 500 may be implemented such that the transistor Q4 becomes an operation voltage while considering operating voltages (voltages in the active area) of the transistors Q1, Q2, and Q3 and voltage drops of the resistors R1 and R2. Here, when the power supply voltage Vcc is 4.6 V to 4.95 V, the transistor Q4 may operate in a saturation area. When the transistor Q4 operates in the saturation area, the current Isink flowing through the transistor Q4 increases as the power supply voltage Vcc increases. A bias current Ibias decreases as the current Isink increases, and thus a current Icc flowing through the power transistor 200 is also decreased. Additionally, when the power supply voltage Vcc exceeds 4.95 V, the transistor Q4 is in the active area. When the transistor Q4 operates in the active area, the current Isink passing through the transistor Q4 becomes a predetermined saturation current Isink_sat. When the current Isink is the saturation current Isink_sat, the bias circuit 400 does not operate, and the current Icc flowing through the power transistor 200 may become 0 A. Accordingly, the overvoltage protection circuit 500 can protect the power amplifier 1000 in the overvoltage state of the power supply voltage Vcc. Such an operation of the overvoltage protection circuit 500 will be described in detail with reference to FIG. 3A and FIG. 3B.

Figure 3A:
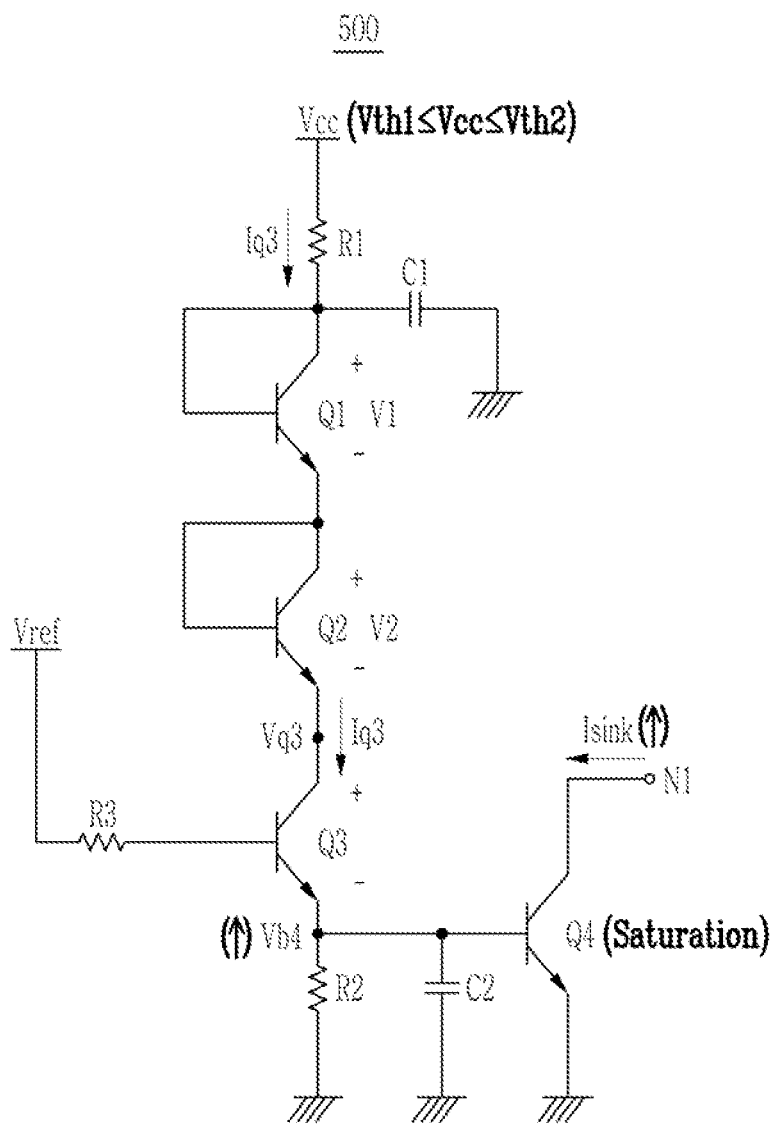
FIG. 3A illustrates an example in which the transistor Q4 of the overvoltage protection circuit, according to the example, operates in a saturation area.

FIG. 3A illustrates an example in which the transistor Q4 of the overvoltage protection circuit 500, according to the example, operates in a saturation area.

In FIG. 3A, it is assumed that the power supply voltage Vcc is greater than or equal to a first threshold value Vth1 and less than or equal to a second threshold value Vth2. As an example, when the maximum voltage of the power supply voltage Vcc is implemented to be 5 V, the first threshold value Vth1 may be 4.6 V and the second threshold value Vth2 may be 4.95 V.

When the power voltage Vcc is greater than or equal to the first threshold value Vth1 and less than or equal to the second threshold value Vth2, the transistors Q1, Q2, and Q3 may operate in the active area. Additionally, the transistor Q4 may operate in the saturation area. Referring to Equation 3, the base voltage Vb4 of the transistor Q4 is increased as the power supply voltage Vcc is increased. Accordingly, the current Isink flowing through the transistor Q4 increases. As the current Isink increases, the bias current Ibias decreases, and the current Icc flowing through the power transistor 200 also decreases.

Figure 3B:
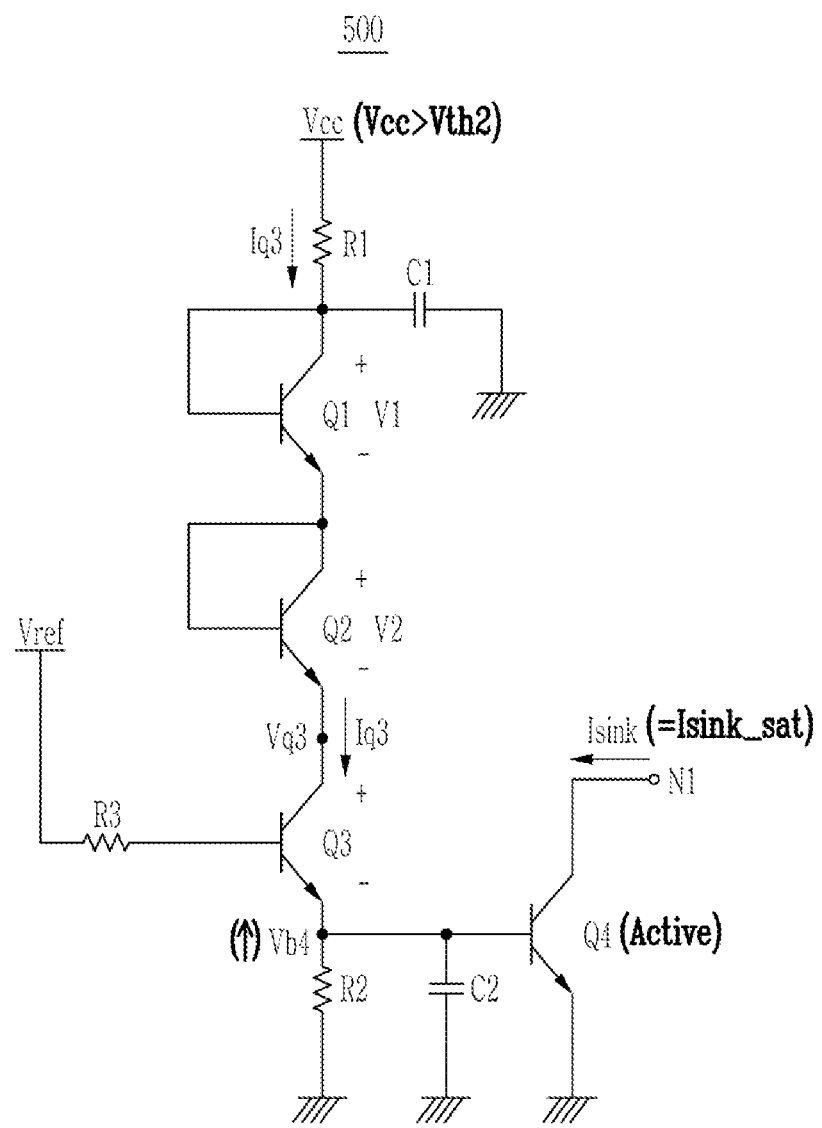
FIG. 3B illustrates an example in which the transistor Q4 of the overvoltage protection circuit, according to the example, operates in the active area.

FIG. 3B illustrates an example in which the transistor Q4 of the overvoltage protection circuit 500 according to an example operates in the active area.

In FIG. 3B, it is assumed that the power supply voltage Vcc exceeds the second threshold value Vth2

In an example, when the maximum voltage of the power supply voltage Vcc is implemented to be 5 V, the second threshold value Vth2 may be 4.95 V.

When the power supply voltage Vcc exceeds the second threshold value Vth2, the transistors Q1, Q2, and Q3 may operate in the active area, and the transistor Q4 may also operate in the active area. Referring to Equation 3, the base voltage Vb4 of the transistor Q4 is increased as the power supply voltage Vcc is increased. When the base voltage Vb4 of the transistor Q4 continues to increase, the transistor Q4 enters the active area. Accordingly, the current Isink passing through the transistor Q4 becomes a predetermined saturation current Isink_sat. When the current Isink becomes the saturation current Isink_sat, the bias circuit 400 does not operate, and the current Icc flowing through the power transistor 200 may be 0 A.

Figure 4:
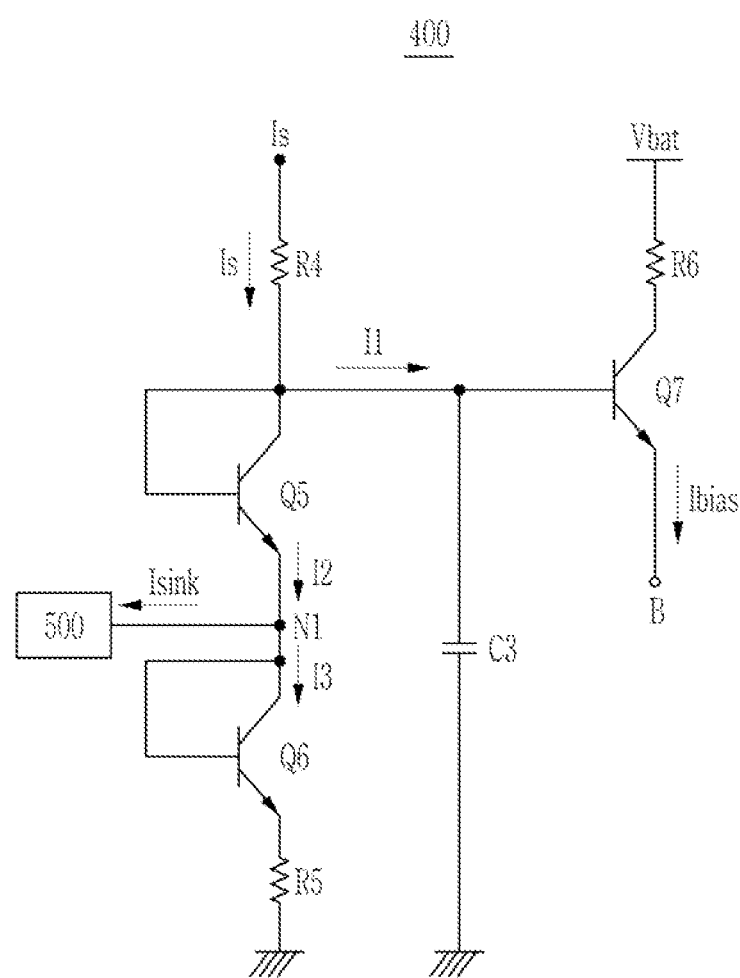
FIG. 4 illustrates the example bias circuit, in accordance with one or more embodiments.

FIG. 4 illustrates the example bias circuit, in accordance with one or more embodiments.

As illustrated in FIG. 4, the bias circuit 400, in accordance with one or more embodiments, may include a transistor Q5, a transistor Q6, a transistor Q7, a resistor R4, a resistor R5, a resistor R6, and a capacitor C3.

The transistors Q5 to Q7 may be respectively implemented as various transistors such as, but not limited to, a heterojunction bipolar transistor (HBT), a bipolar junction transistor (BJT), an insulated gate bipolar transistor (IGBT), and the like. Additionally, in FIG. 4, the transistors Q1 to Q4 are described as a npn type. However, this is only an example, and the transistors Q1 to Q4 may be implemented with a pnp type.

A base and a collector of the transistor Q5 may be connected with each other, and the collector of the transistor Q5 may be connected to a power current Is through the resistor R4. The transistor Q5 may have a diode connection structure. The transistor Q5 sinks a current I2 from the power current Is.

A base and a collector of the transistor Q6 may be connected with each other, and the collector of the transistor Q6 may be connected to an emitter of the transistor Q5. In an example, a point where the collector of the transistor Q6 and the emitter of the transistor Q5 are connected is the above-described terminal N1 of the bias circuit 400. The terminal N1 of the bias circuit 400 may be connected to the overvoltage protection circuit 500 (i.e., the collector of the transistor Q4). The transistor Q6 may have a diode connection structure, and an emitter of the transistor Q6 may be connected to the ground through the resistor R5.

A collector of the transistor Q7 may be connected to a power voltage Vbat through the resistor R6, and a base of the transistor Q7 may be connected to the collector of the transistor Q5. Additionally, an emitter of the transistor Q7 may be connected to an input terminal B of the power transistor 200, and may supply the bias current Ibias to the power transistor 200. The power voltage Vbat may be, as an example, a battery voltage supplied from a battery.

Additionally, the capacitor C3 may be connected between a base of the transistor Q7 and the ground, and may perform removal of an AC component from the current I1 flowing to the base of the transistor Q7.

In FIG. 4, current I2 denotes the current flowing through the transistor Q5, and current I3 denotes a current flowing through the transistor Q6. Additionally, current I1 denotes a current flowing to the base of the transistor Q7.

The power current Is, the current I1, and the current I2 satisfy a relationship represented in Equation 4 below.

$$Is = I1 + I2 \qquad \text{Equation 4:}$$

In the terminal N1, the current I2, the current Isink, and the current I3 satisfy a relationship of the following Equation 5 below.

$$I2 = Isink + I3 \qquad \text{Equation 5:}$$

In Equation 5, when it is assumed that the current I3 has a fixed value, the current I2 increases as the current Isink increases. Referring to Equation 4, since the current Is has a fixed value, the current I1 decreases as the current I2 increases. Since the current I1 and the bias current Ibias have a proportional relationship, when the current I1 decreases, the bias current Ibias decreases. That is, when the current Isink increases, the bias current Ibias decreases. As described above, the overvoltage protection circuit 500 increases the current Isink as the power supply voltage Vcc increases. Additionally, as the current Isink increases, the bias current Ibias decreases. When the bias current Ibias decreases, the current Icc flowing through the power transistor 200 decreases. Accordingly, the power transistor 200 may be protected in the overvoltage state. In an example, when the current Isink becomes the saturation current Isink_sat, the current I1 may become 0 A, and the bias current Ibias may become 0 A.

FIG. 4 illustrates the bias circuit 400. However, the structure of the bias circuit as illustrated in FIG. 4 is only an example. The bias circuit 400 may be implemented with various structures.

Figure 5:
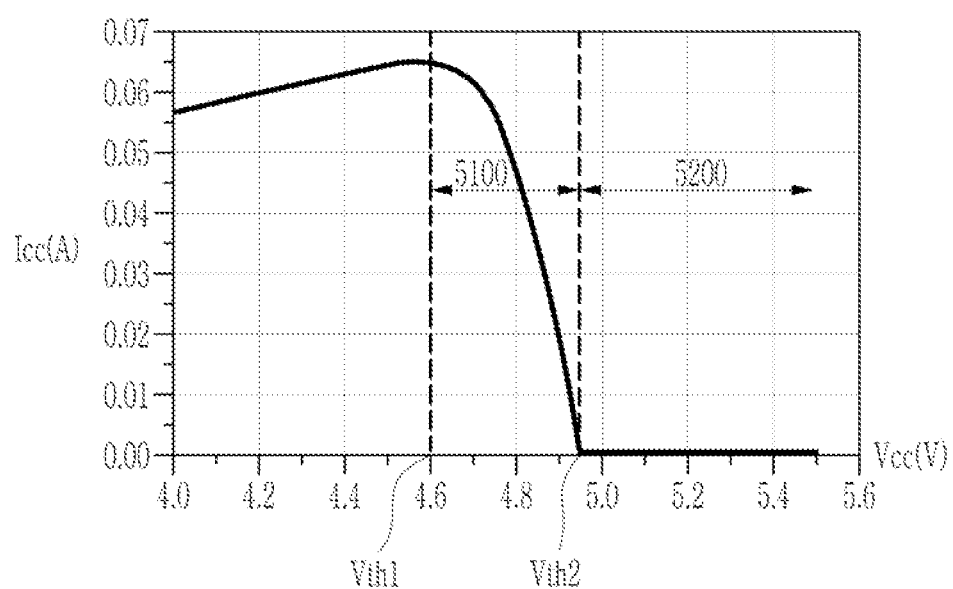
FIG. 5 illustrates a simulation result of the power amplifier 500, in accordance with one or more embodiments.

FIG. 5 illustrates a simulation result of the example power amplifier 500, in accordance with one or more embodiments.

In the simulation of FIG. 5, the horizontal axis denotes the power supply voltage Vcc, and the vertical axis denotes the current Icc flowing through the power transistor 200. In a section where the power supply voltage Vcc increases from 4.0 V to 5.5 V, it is assumed that the first threshold value Vth1 of the power supply voltage Vcc is 4.6 V, and the second threshold value Vth2 of the power supply voltage Vcc is 4.95 V.

A first section 5100 is a section during which the transistor Q4 operates in the saturation area. As illustrated in FIG. 5, in the first section 5100, the current Icc decreases as the power supply voltage Vcc increases. In the first section 5100, the base voltage Vb3 of the transistor Q4 increases as the power supply voltage Vcc increases. Accordingly, the current Isink flowing through the transistor Q4 is increased. As the current Isink increases, the bias current Ibias decreases, and the current Icc decreases.

A second section 5200 is a section during which the transistor Q4 operates in the active area. As illustrated in FIG. 5, in the second section 5200, the current Icc becomes 0 A. When the power supply voltage Vcc exceeds the second threshold value Vth2, the transistor Q4 enters the active area. Accordingly, the current Isink passing through the transistor Q4 becomes a predetermined saturation current Isink_sat. When the current Isink is the saturation current Isink_sat, the bias circuit 400 does not operate, and the current Icc flowing through the power transistor 200 becomes 0 A.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A protection circuit, configured to protect a power amplifier comprising a power transistor configured to receive a power supply voltage, and a bias circuit configured to supply a bias current to the power transistor, the protection circuit comprising:
    a first transistor, connected between a terminal of the bias circuit and a ground, and configured to sink a first current from the terminal of the bias circuit; and
    a second transistor, comprising a first terminal connected to the power supply voltage, a second terminal connected to a control terminal of the first transistor, and a control terminal connected to a reference voltage,
    wherein a voltage corresponding to the power supply voltage is output at the second terminal of second transistor.

2. The protection circuit of claim 1, wherein the first current is fluctuated based on the power supply voltage.

3. The protection circuit of claim 2, wherein:
    the first current increases when the power supply voltage increases above a first threshold voltage, and
    a second current flowing through the power transistor is decreased when the first current increases.

4. The protection circuit of claim 3, wherein when the power supply voltage is greater than the first threshold voltage, a voltage at the second terminal of the second transistor increases, and a voltage at the control terminal of the first transistor increases.

5. The protection circuit of claim 1, wherein:
    when the power amplifier operates, the reference voltage is applied to the control terminal of the first transistor, and
    when the power amplifier does not operate, the reference voltage is not applied to the control terminal of the first transistor.

6. The protection circuit of claim 3, wherein:
    when the power supply voltage is greater than the first threshold voltage and less than a second threshold voltage, the first transistor operates in a saturation area, and
    when the power supply voltage is greater than the second threshold voltage, the second transistor operates in an active area.

7. The protection circuit of claim 6, wherein:
    when the first transistor operates in the saturation area, the second current decreases as the power supply voltage increases, and
    when the second transistor operates in the active area, the second current does not flow.

8. The protection circuit of claim 1, wherein the control terminal of the second transistor is connected to the reference voltage through a first resistor.

9. The protection circuit of claim 8, wherein the second terminal of the second transistor is connected to the ground through a second resistor.

10. The protection circuit of claim 9, further comprising at least one additional transistor connected between the power supply voltage and the first terminal of the second transistor, and
    wherein the at least one additional transistor is configured to have a diode connection structure.

11. The protection circuit of claim 10, further comprising a third resistor connected between the power supply voltage and the at least one additional transistor.

12. The protection circuit of claim 1, wherein the bias circuit comprises:
    a third transistor, comprising a first terminal connected to a power supply current, and configured to sink a predetermined current from the power supply current; and
    a fourth transistor, comprising a control terminal connected to the power supply current, and configured to supply the bias current,
    wherein the terminal of the bias circuit is a second terminal of the third transistor.

13. A power amplifier, comprising:
    a power transistor, configured to amplify an input radio frequency (RF) signal;
    a bias circuit, configured to supply a bias current to the power transistor; and
    an overvoltage protection circuit, configured to detect a power voltage supplied to the power transistor, and sink a first current from a terminal of the bias circuit corresponding to the power voltage, and
    the overvoltage protection circuit comprises:
    a first transistor, comprising a first terminal connected to the power voltage, and configured to output a first voltage corresponding to the power voltage to a second terminal of the first transistor, and
    a second transistor, comprising a control terminal connected to the second terminal of the first transistor, and a first terminal connected to the terminal of the bias circuit,
    wherein the second transistor is configured to sink the first current corresponding to the first voltage.

14. The power amplifier of claim 13, wherein a control terminal of the first transistor is connected to a reference voltage, and when the power amplifier operates, the reference voltage is applied to the control terminal of the first transistor.

15. The power amplifier of claim 14, wherein when the power amplifier does not operate, the reference voltage is not applied to the control terminal of the first transistor.

16. The power amplifier of claim 14, wherein:
the overvoltage protection circuit further comprises:
at least one additional transistor connected between the power voltage and the first terminal of the first transistor, and the additional transistor is configured to have a diode connection structure, and
a first resistor, connected between the second terminal of the first transistor and a ground.

17. The power amplifier of claim 13, wherein:
when the power voltage increases, the first current increases, and
when the first current increases, a second current flowing through the power transistor decreases.

18. The power amplifier of claim 13, wherein:
the bias circuit further comprises:
a third transistor, comprising a first terminal connected to a power current, and configured to sink a predetermined current from the power current, and
a fourth transistor, comprising a control terminal connected to the power current, and configured to supply the bias current,
wherein the terminal of the bias circuit is a second terminal of the third transistor.

19. A transmission device, comprising:
a power amplifier, configured to amplify a radio frequency (RF) signal, the power amplifier comprising:
an overvoltage protection circuit;
a power transistor, configured to amplify power with respect to the RF signal; and
a bias circuit, configured to supply a bias current to the power transistor;
wherein the overvoltage protection circuit comprises:
a first transistor, connected to a terminal of the bias circuit, and configured to sink a current received from the terminal of the bias circuit;
a second transistor, comprising an emitter connected to a base of the first transistor, and a base connected to a reference voltage, and
a third transistor, comprising an emitter connected to a collector of the second transistor, and a collector connected to a power supply voltage.

20. The transmission device of claim 19, wherein the overprotection circuit is configured to operate when the power supply voltage exceeds a first threshold, and sink the current received from the terminal of the bias circuit.

21. The transmission device of claim 19, wherein the base of the second transistor is connected to the reference voltage through a first resistor, and the emitter of the second transistor is connected to a ground through a second resistor.

22. The transmission device of claim 19, wherein the power amplifier further comprises an input matching network and an output matching network, and
wherein the input matching network is connected to a base of the power transistor, and is configured to perform impedance matching between the RF signal and the power transistor.

* * * * *